(12) United States Patent
Wu et al.

(10) Patent No.: US 12,087,612 B2
(45) Date of Patent: Sep. 10, 2024

(54) MICRO DEVICE STRUCTURE AND DISPLAY APPARATUS

(71) Applicant: Industrial Technology Research Institute, Hsinchu (TW)

(72) Inventors: Ming-Hsien Wu, Hsinchu County (TW); Wei-Hung Kuo, Hsinchu (TW); Chu-Li Chao, Hsinchu (TW); Chu-Yin Hung, Hsinchu (TW); Yu-Hsiang Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 358 days.

(21) Appl. No.: 17/482,409

(22) Filed: Sep. 22, 2021

(65) Prior Publication Data
US 2022/0367230 A1    Nov. 17, 2022

(30) Foreign Application Priority Data
May 11, 2021   (TW) .................................. 110116846

(51) Int. Cl.
*H01L 21/683* (2006.01)
*H01L 25/075* (2006.01)
*H01L 33/62* (2010.01)

(52) U.S. Cl.
CPC ...... *H01L 21/6835* (2013.01); *H01L 25/0753* (2013.01); *H01L 33/62* (2013.01);
(Continued)

(58) Field of Classification Search
CPC . H01L 21/6835; H01L 25/0753; H01L 33/62; H01L 2221/68354;
(Continued)

(56) References Cited

U.S. PATENT DOCUMENTS

| | | | |
|---|---|---|---|
| 6,197,609 B1* | 3/2001 | Tsutsui | H01L 33/0095 438/33 |
| 7,259,041 B2* | 8/2007 | Stelzl | H03H 9/1078 257/659 |

(Continued)

FOREIGN PATENT DOCUMENTS

| | | |
|---|---|---|
| CN | 110610893 | 12/2019 |
| TW | 200308055 | 12/2003 |
| TW | I680602 | 12/2019 |

OTHER PUBLICATIONS

Sang-Il Park et al., "Printed Assemblies of Inorganic Light-Emitting Diodes for Deformable and Semitransparent Displays," Science, Aug. 21, 2009, pp. 977-981.

(Continued)

*Primary Examiner* — Vu A Vu
(74) *Attorney, Agent, or Firm* — JCIPRNET

(57) ABSTRACT

A micro device structure including a device and a fixed structure is provided. The device has an upper surface, a lower surface, and a first side surface. The lower surface is opposite to the upper surface. The first side surface connects the upper surface and the lower surface. The fixing structure includes a connecting portion and a first turning portion. The connecting portion extends at least from the upper surface of the device to the first side surface. The first turning portion is in contact to be connected with a first end of the connecting portion and extends outward from the first side surface to be away from the first side surface. The first end of the connecting portion is located on the first side surface between the upper surface and the lower surface. A display apparatus is also provided.

16 Claims, 16 Drawing Sheets

(52) U.S. Cl.
CPC .............. *H01L 2221/68354* (2013.01); *H01L 2221/68368* (2013.01); *H01L 2933/0066* (2013.01)

(58) Field of Classification Search
CPC ... H01L 2221/68368; H01L 2933/0066; H01L 25/167; H01L 33/0095; H01L 2221/68363; H01L 27/156; H01L 33/486
USPC .......................................................... 257/89
See application file for complete search history.

(56) References Cited

U.S. PATENT DOCUMENTS

| | | | | |
|---|---|---|---|---|
| 7,388,281 B2 * | 6/2008 | Krueger | ............... | H03H 9/0557 257/E29.022 |
| 7,544,540 B2 * | 6/2009 | Bauer | ................. | H03H 9/1057 438/108 |
| 7,795,076 B2 | 9/2010 | Arneson et al. | | |
| 8,552,436 B2 | 10/2013 | Bibl et al. | | |
| 8,580,613 B2 * | 11/2013 | Feiertag | ................. | G01L 19/141 438/109 |
| 8,791,474 B1 | 7/2014 | Bibl et al. | | |
| 8,809,875 B2 | 8/2014 | Bibl et al. | | |
| 9,217,541 B2 * | 12/2015 | Bathurst | ............. | H01L 21/7806 |
| 9,368,683 B1 * | 6/2016 | Meitl | ...................... | H01L 33/62 |
| 9,741,592 B2 | 8/2017 | Hu et al. | | |
| 9,844,128 B2 * | 12/2017 | Pahl | ......................... | H01L 23/10 |
| 9,887,180 B2 * | 2/2018 | Meitl | ................. | H01L 33/0095 |
| 9,897,301 B1 * | 2/2018 | Peng | ......................... | H01R 33/22 |
| 9,929,053 B2 * | 3/2018 | Bower | .................. | B81C 99/008 |
| 10,074,768 B2 | 9/2018 | Meitl et al. | | |
| 10,468,391 B2 * | 11/2019 | Cok | ..................... | H01L 25/0753 |
| 11,088,297 B2 * | 8/2021 | Höppel | .................... | H01L 33/50 |
| 11,139,797 B2 * | 10/2021 | Bower | ..................... | H03H 3/08 |
| 2008/0006922 A1 | 1/2008 | Gutentag | | |
| 2010/0240196 A1 | 9/2010 | Saito et al. | | |
| 2011/0084377 A1 | 4/2011 | Chien et al. | | |
| 2013/0126891 A1 | 5/2013 | Bibl et al. | | |
| 2015/0084054 A1 | 3/2015 | Fan et al. | | |
| 2019/0363000 A1 | 11/2019 | Wu et al. | | |
| 2020/0066954 A1 | 2/2020 | Kuo | | |
| 2020/0194616 A1 | 6/2020 | Henley | | |
| 2021/0265327 A1 * | 8/2021 | Koo | ........................ | H01L 25/13 |
| 2022/0181185 A1 * | 6/2022 | Loi | ...................... | H01L 21/6835 |

OTHER PUBLICATIONS

Zheng Gong et al., "Size-dependent light output, spectral shift, and self-heating of 400 nm InGaN light-emitting diodes," J. Appl. Phys., Jan. 6, 2010, pp. 1-7.

Bok Y. Ahn et al., "Omnidirectional Printing of Flexible, Stretchable and Spanning Silver Microelectrodes," Science, Mar. 20, 2009, pp. 1590-1593.

Pengfei Tian et al., "Size-dependent efficiency and efficiency droop of blue InGaN micro-light emitting diodes," Appl. Phys. Lett., Dec. 6, 2012, pp. 1-5.

Seongmo Hwang et al., "A Hybrid Micro-Pixel Based Deep Ultraviolet Light-Emitting Diode Lamp," Applied Physics Express, Jan. 2011, pp. 1-4.

"Notice of allowance of Taiwan Counterpart Application", issued on Nov. 19, 2021, p. 1-p. 3.

* cited by examiner

MICRO DEVICE STRUCTURE AND DISPLAY APPARATUS

CROSS-REFERENCE TO RELATED APPLICATION

This application claims the priority benefit of Taiwanese application no. 110116846, filed on May 11, 2021. The entirety of the above-mentioned patent application is hereby incorporated by reference herein and made a part of this specification.

BACKGROUND

The technical field relates to a micro device structure and a display apparatus.

With the advancement of science and technology, many electronic devices have gradually been developed toward being miniaturized in volume. The miniaturized electronic devices may require to be transferred to be disposed on corresponding circuit boards for subsequent applications at the consumer end. Therefore, during the process of manufacture or application, how the miniaturized electronic devices may be efficiently transferred (e.g., the speed or yield during the pick-up process may be increased) has currently become a popular research topic.

SUMMARY

One of exemplary embodiments provides a micro device structure. The micro device structure includes a device and a fixed structure. The device has an upper surface, a lower surface, and a first side surface. The lower surface is opposite to the upper surface. The first side surface connects the upper surface and the lower surface. The fixing structure includes a connecting portion and a first turning portion. The connecting portion extends at least from the upper surface of the device to the first side surface. The first turning portion is in contact to be connected with a first end of the connecting portion and extends outward from the first side surface to be away from the first side surface. The first end of the connecting portion is located on the first side surface between the upper surface and the lower surface.

One of exemplary embodiments provides a display apparatus. The display apparatus includes a micro light-emitting device and a fixed structure. The micro light-emitting device has an upper surface, a lower surface, and a first side surface. The lower surface is opposite to the upper surface. The first side surface connects the upper surface and the lower surface. The fixing structure includes a connecting portion and a first turning portion. The connecting portion extends at least from the upper surface of the device to the first side surface. The first turning portion is in contact to be connected with a first end of the connecting portion and extends outward from the first side surface to be away from the first side surface. The first end of the connecting portion is located on the first side surface between the upper surface and the lower surface. A tip of the first turning portion away from the first side surface is suspended.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
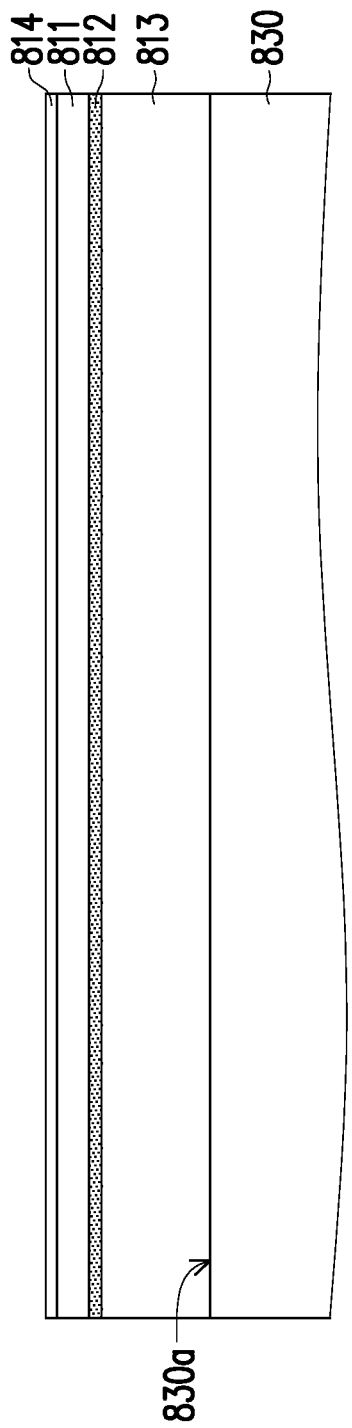
FIG. 1A to FIG. 1H are schematic partial cross-sectional views of part of a manufacturing method of a micro device structure according to an exemplary embodiment.

For clarity of the drawings, the size of some devices or film layers may be enlarged or reduced.

For clarity of illustration, some devices or film layers may be omitted or labeled in the drawings.

In addition, a numerical value indicated in the specification may include the numerical value and deviated values within a deviation range acceptable to persons with common general knowledge in the art. For example, "about" or "substantially" as used herein includes the value and the average within the acceptable deviation range (e.g., ±10%) of the specific value determined by those ordinarily skilled in the art, taking into consideration the measurement in question and the specific number of errors associated with the measurement (i.e., limitations or errors of the measurement system or limitations or errors of the process system, but not limited thereto).

FIG. 1A to FIG. 1H are schematic partial cross-sectional views of part of a manufacturing method of a micro device structure according to an exemplary embodiment.

With reference to FIG. 1A, a substrate 830 is provided. A second type semiconductor material layer 813, a light-emitting material layer 812, a first type semiconductor material layer 811, and a first conductive material layer 814 are sequentially stacked on a surface 830a of the substrate 830. The materials or structures of, or manners for forming the substrate 830, the second type semiconductor material layer 813, the light-emitting material layer 812, the first type semiconductor material layer 811, and/or the first conductive material layer 814 may be selected by those who are familiar with the art, and the disclosure is not limited thereto. In addition, the first conductive material layer 814 may be formed depending on requirements, and the disclosure is not limited thereto.

Figure 1B:
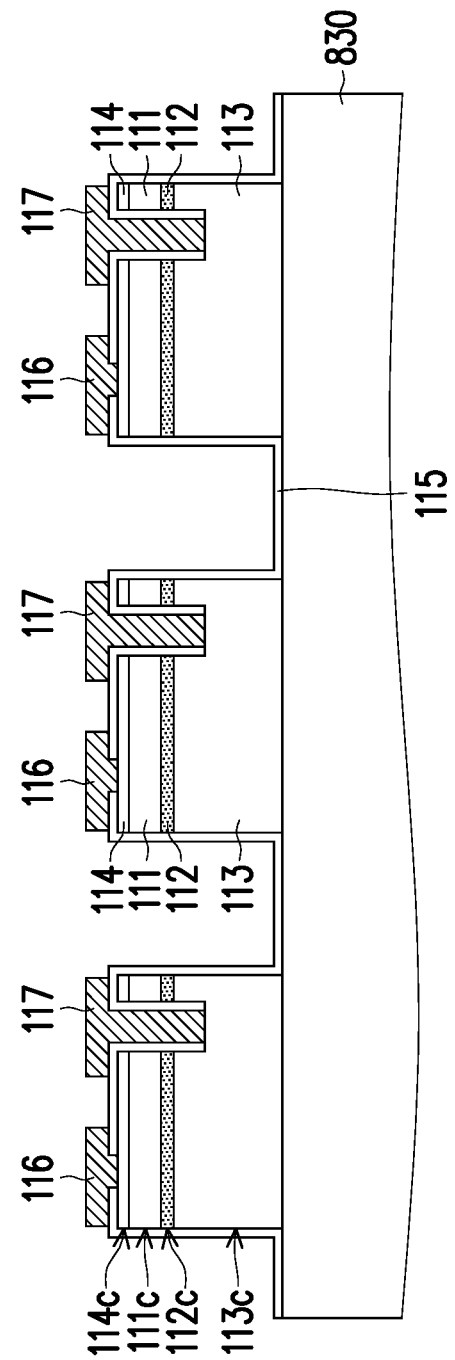

With reference to FIG. 1A to FIG. 1B, after the first type semiconductor material layer 811 is formed, part of the second type semiconductor material layer 813, the light-emitting material layer 812, the first type semiconductor material layer 811, and the first conductive material layer 814 may be removed to expose part of the substrate 830. Moreover, a patterned second type semiconductor layer 113, a patterned light-emitting layer 112, a patterned first type semiconductor layer 111, and a patterned first conductive layer 114 are formed correspondingly. The manner for removing the above film layers may be selected by those skilled in the art, and the disclosure is not limited thereto.

With continued reference to FIG. 1B, after the second type semiconductor layer 113, the light-emitting layer 112, the first type semiconductor layer 111, and the first conductive layer 114 are patterned, a patterned isolating layer 115 is formed. For example, the patterned isolating layer 115 may cover the sidewalls of the first type semiconductor layer 111, the light-emitting layer 112, the second type semiconductor layer 113, and the first conductive layer 114, as well as part of the substrate 830 exposed by the first type semiconductor layer 111, the light-emitting layer 112, and the second type semiconductor layer 113. Nonetheless, the disclosure is not limited thereto.

The material of or manner for forming the patterned isolating layer 115 may be selected by those skilled in the art, and the disclosure is not limited thereto.

With continued reference to FIG. 1B, after the patterned isolating layer 115 is formed, a first electrode 116 and a second electrode 117 are formed. The first electrode 116 is electrically connected to the first type semiconductor layer 111. The second electrode 117 is electrically connected to the second type semiconductor layer 113. In an embodiment, the first electrode 116 and the first type semiconductor layer 111 may be electrically connected through the corresponding first conductive layer 114. Nonetheless, the disclosure is not limited thereto.

In addition, for clarity of illustration, in FIG. 1B or subsequent figures, not all of the first type semiconductor layer 111, the light-emitting layer 112, the second type semiconductor layer 113, the first conductive layer 114, the patterned isolating layer 115, the first electrode 116, the second electrode 117, or other similar components or corresponding positions are illustrated.

Figure 1C:
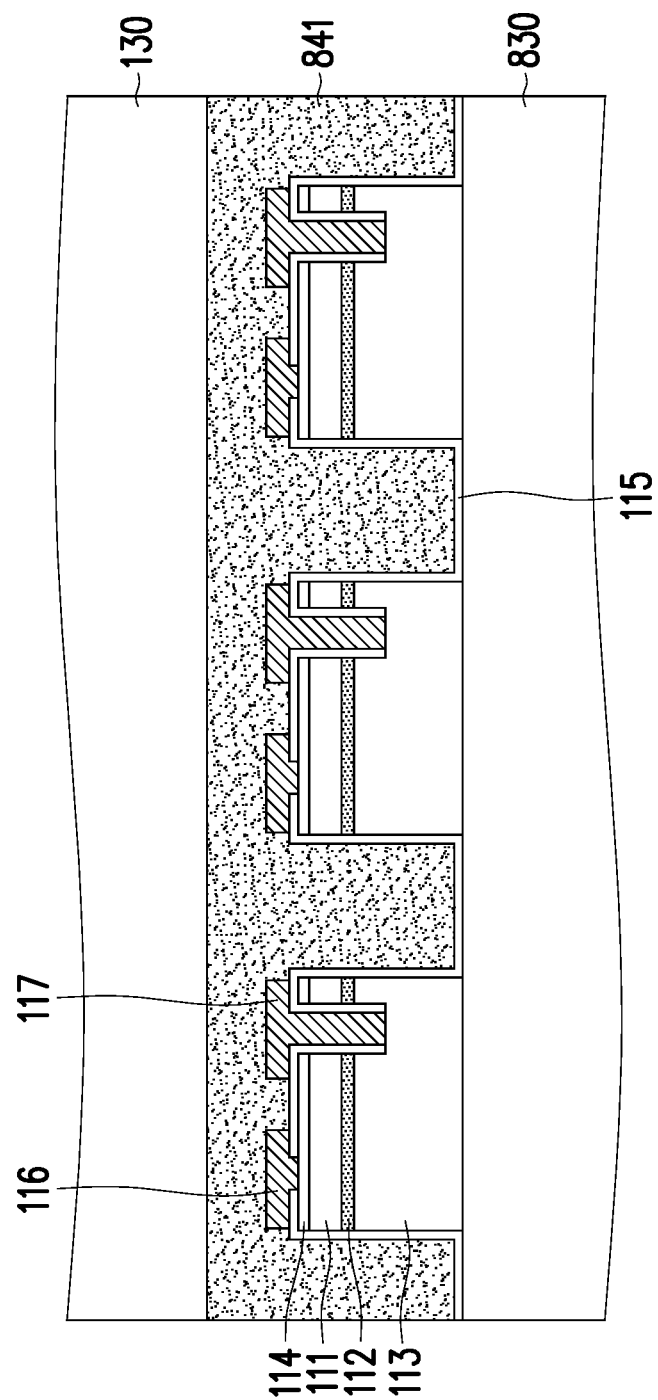

With reference to FIG. 1B to FIG. 1C, after the first electrode 116 and the second electrode 117 are formed, a filler material layer 841 is formed on the substrate 830.

In this embodiment, the material of the filler material layer 841 may include benzocyclobutene (BCB), cycloalkenes, polyimides, polyamides, polyesters, polyols, polyethylene oxides, polyphenylenes, resins, polyethers, polyketones, or other similar polymers or a combination of the above materials. As such, in the subsequent manufacturing process, the filler material layer 841 may be removed by an etching reagent. The manner for forming or removing the filler material layer 841 may be selected by those skilled in the art, and the disclosure is not limited thereto.

With continued reference to FIG. 1C, after the filler material layer 841 is formed, a carrier 130 may be disposed on the filler material layer 841. In an embodiment, a corresponding adhesive material may be present between the carrier 130 and the filler material layer 841, but the disclosure is not limited thereto.

Figure 1D:
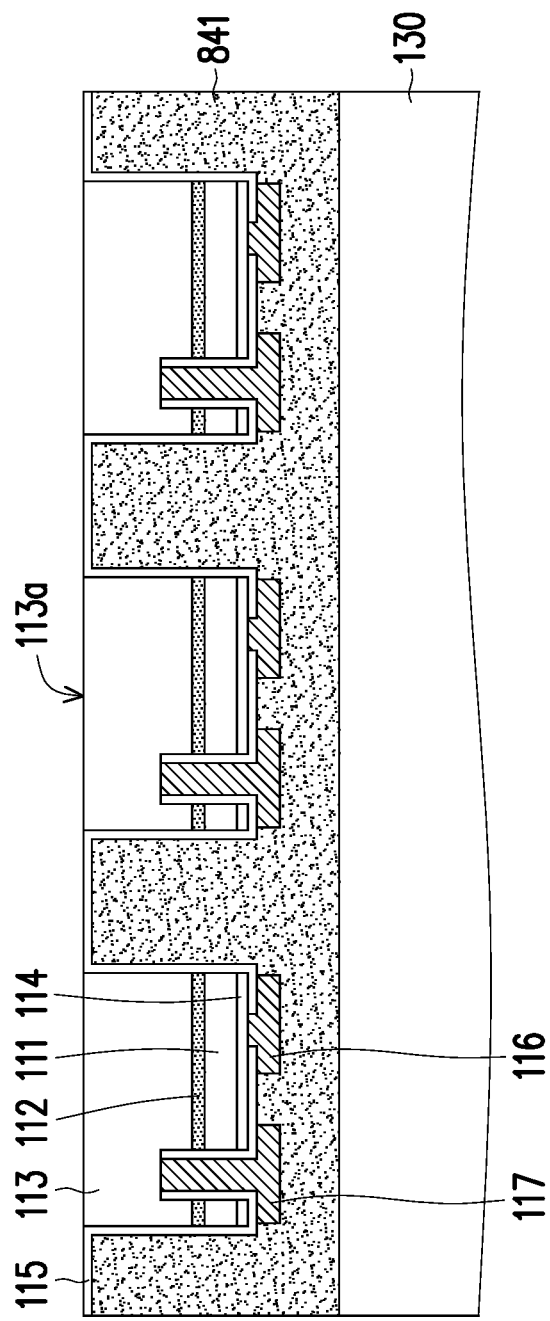

With reference to FIG. 1C to FIG. 1D, after the carrier 130 is disposed, the substrate 830 may be removed. For example, the structure illustrated in FIG. 1C may be rotated or flipped upside down. Then, the substrate 830 is removed.

In this embodiment, after the substrate 830 is removed, an upper surface 113a (i.e., the surface most away from the first type semiconductor layer 111) of the second type semiconductor layer 113 may be exposed.

Figure 1E:
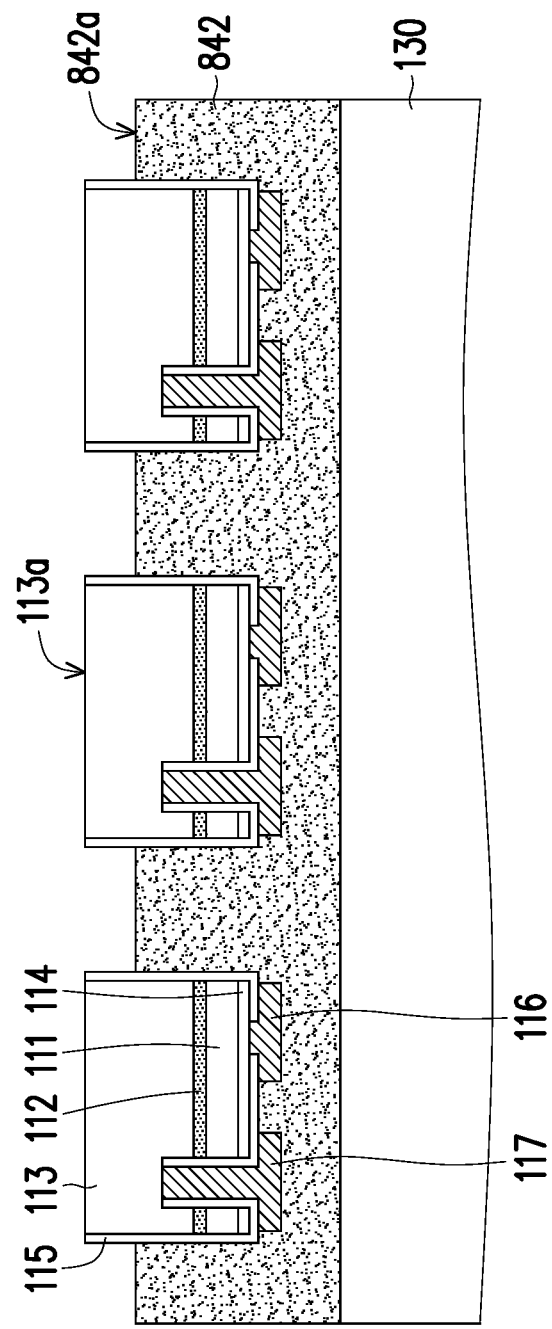

With reference to FIG. 1D to FIG. 1E, after the substrate 830 is removed, part of the filler material layer 841 (labeled in FIG. 1D) may be removed. For example, part of the filler material layer 841 (labeled in FIG. 1D) may be removed by etching with an etching reagent to form a thinner filler material layer 842 (labeled in FIG. 1E). As a result, a surface 842a of the filler material layer 842 may be lower than the upper surface 113a of the second type semiconductor layer 113.

In this embodiment, when or before part of the filler material layer 841 (labeled in FIG. 1D) is removed, part of the patterned isolating layer 115 may be removed. That is, the patterned isolating layer 115 may substantially not cover the surface 824a of the thinner filler material layer 842 (labeled in FIG. 1E).

In an embodiment, by dry etching, wet etching, laser drilling, or grinding, part of the patterned isolating layer 115 may be removed. Nonetheless, the disclosure is not limited thereto.

In this embodiment, the surface 842a of the filler material layer 842 is substantially parallel to the upper surface 113a of the second type semiconductor layer 113, but the disclosure is not limited thereto.

Figure 1F:
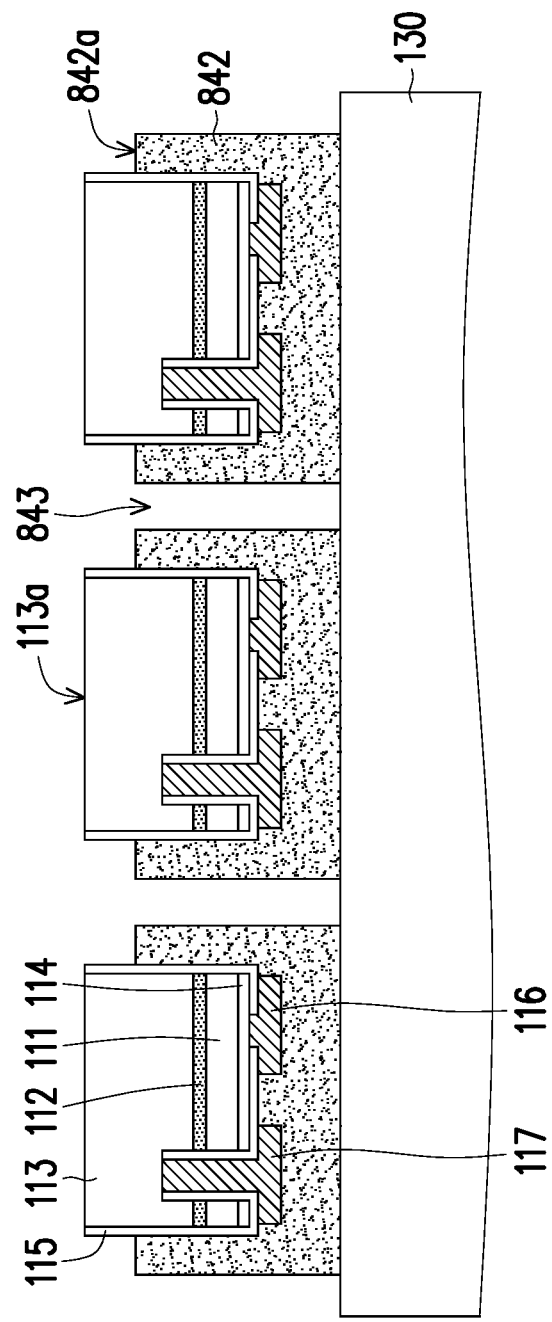

With reference to FIG. 1E to FIG. 1F, part of the filler material layer 842 is removed to expose part of the carrier 130. For example, by dry etching, wet etching, laser drilling, or mechanical drilling, one or more openings or trenches 843 penetrating the filler material layer 842 may be formed.

Figure 1G:
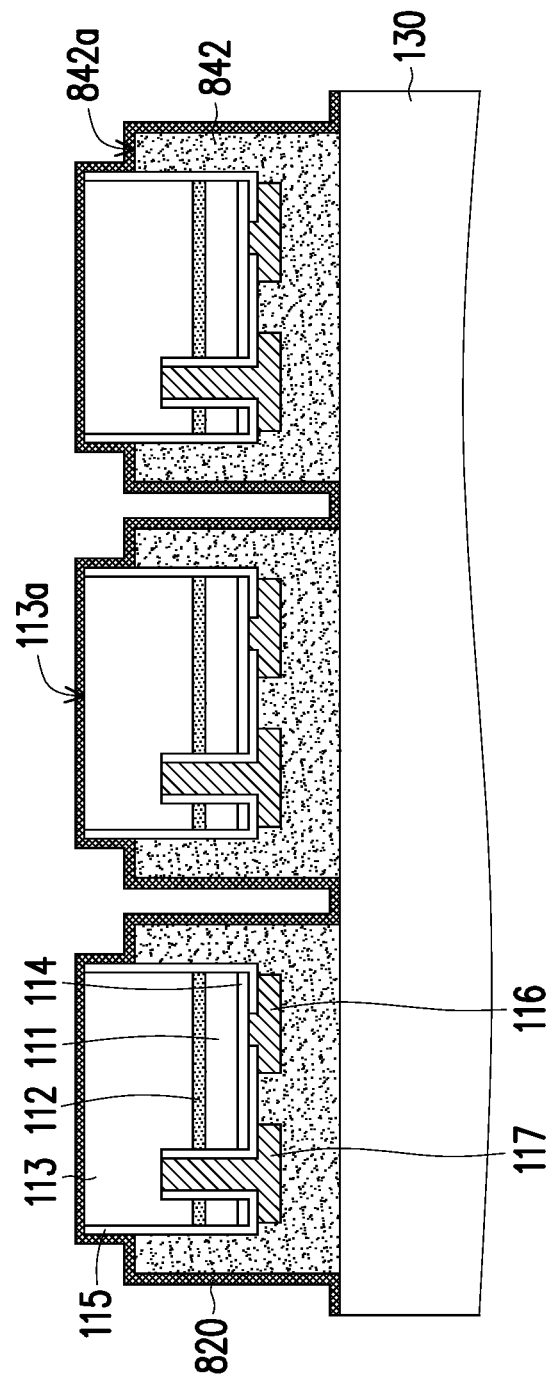

With reference to FIG. 1F to FIG. 1G, after part of the filler material layer 842 is removed to expose part of the carrier 130, a fixed material layer 820 may be formed on the second type semiconductor layer 113 and the filler material layer 842. The fixed material layer 820 may extend from the upper surface 113a of the second type semiconductor layer 113 to the surface of the filler material layer 842, and may be further filled in the openings or trenches 843 (labeled in FIG. 1F) of the filler material layer 842 to be connected to the carrier 130. The material of or manner for forming the fixed material layer 820 may be selected by those skilled in the art, and the disclosure is not limited thereto.

In this embodiment, the material of the fixed material layer 820 may be different from the material of the filler material layer 842. For example, in this embodiment, the material of the fixed material layer 820 may include silicon oxide, silicon nitride, silicon oxynitride, or aluminum oxide or a combination of the above materials, but the disclosure is not limited thereto.

Figure 1H:
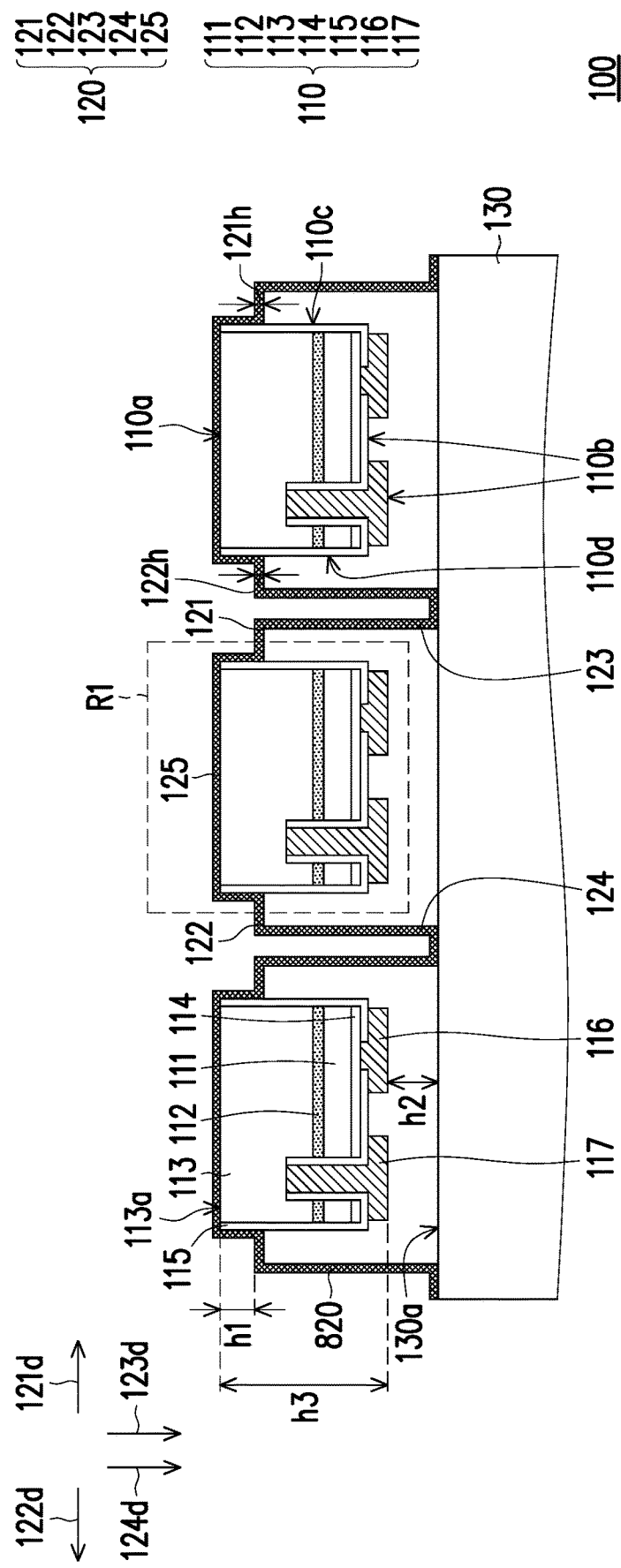

With reference to FIG. 1G to FIG. 1H, after the fixed material layer 820 is formed, the filler material layer 842 is removed. The manner for removing the filler material layer 842 may be selected by those skilled in the art, and the disclosure is not limited thereto. For example, the filler material layer 842 may be removed by wet etching.

In this embodiment, after the filler material layer 842 is removed, part or the entirety of the fixed material layer 820 may serve as a fixed structure 120 for supporting or fixing without external force.

After the above process, a micro device structure 100 of this embodiment may be substantially completed.

Figure 1I:
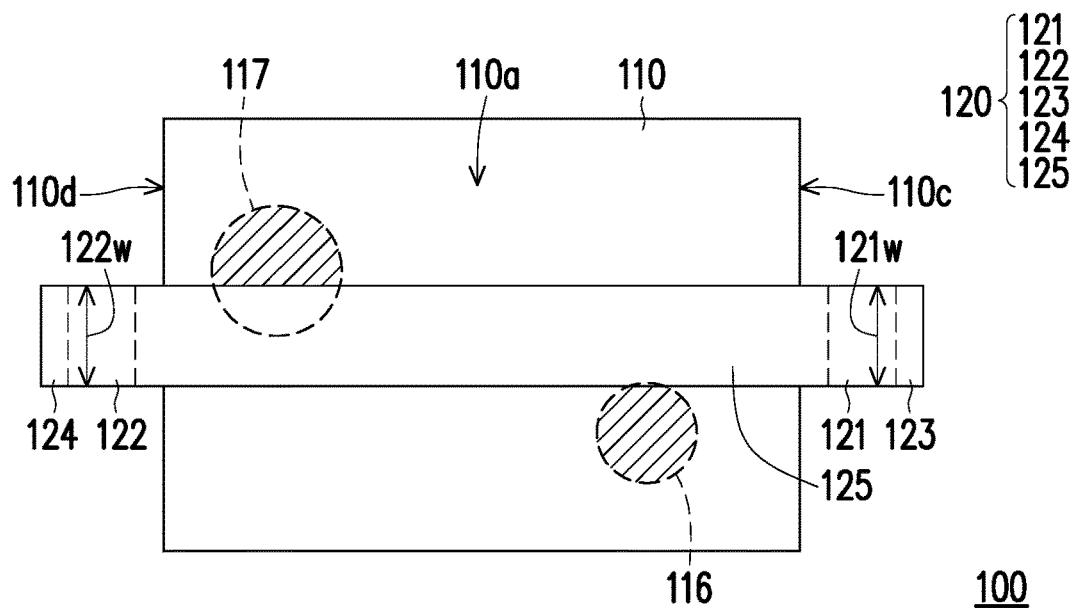
FIG. 1I is a schematic partial top view of a micro device structure according to an exemplary embodiment.

FIG. 1H may be a schematic partial cross-sectional view of a micro device structure according to an exemplary embodiment. FIG. 1I may be a schematic partial top view of a micro device structure according to an exemplary embodiment. For example, FIG. 1I may be a schematic top view corresponding to region R1 in FIG. 1H.

With reference to FIG. 1H to FIG. 1I, the micro device structure 100 includes a device 110 and the fixed structure 120. The device 110 may have an upper surface 110a, a lower surface 110b, a first side surface 110c, and a second side surface 110d. The lower surface 110b is opposite to the upper surface 110a. The first side surface 110c is opposite to the second side surface 110d. Two opposite ends of the first side surface 110c are respectively connected to one side of the upper surface 110a and one side of the lower surface 110b. Two opposite ends of the second side surface 110d are respectively connected to another side of the upper surface 110a and another side of the lower surface 110b. The fixed structure 120 includes a connecting portion 125 and a first turning portion 121. The connecting portion 125 extends at least from the upper surface 110a of the device 110 to the first side surface 110c to be connected to the device 110. The first turning portion 121 is connected with the connecting portion 125. Along a first extension direction 121d, the first turning portion 121 may extend outward from the first side surface 110c of the device 110 (i.e., in a direction away from the device 110). The first turning portion 121 is between the upper surface 110a and the lower surface 110b. In this embodiment, the device 110 may include the first type semiconductor layer 111, the light-emitting layer 112, the second type semiconductor layer 113, and the patterned isolating layer 115.

In this embodiment, the first extension direction 121d may be substantially parallel to the upper surface 110a.

In this embodiment, a width 121w of the first turning portion 121 is between 0.1 micrometer (μm) and 20 μm.

In this embodiment, a thickness 121h of the first turning portion 121 is less than 3 μm.

In this embodiment, the connecting portion 125 may further extend from the upper surface 110a of the device 110 to the second side surface 110d to be connected to the device 110. In addition, the fixed structure 120 may further include a second turning portion 122. The second turning portion 122 is connected with the connecting portion 125, and the second turning portion 122 is different from the first turning portion 121. Along a second extension direction 122d, the second turning portion 122 may extend outward from the second side surface 110d of the device 110 (i.e., in a direction away from the device 110). The second turning portion 122 is between the upper surface 110a and the lower surface 110b.

In this embodiment, the second extension direction 122d may be substantially parallel to the upper surface 110a.

In this embodiment, a width 122w of the second turning portion 122 is between 0.1 μm to 20 μm.

In this embodiment, a thickness 122h of the second turning portion 122 is less than 3 μm.

In an embodiment, the first turning portion 121 and/or the second turning portion 122 may be referred to as a protruding structure.

In this embodiment, a first distance h1 is present between the upper surface 110a of the device 110 and the protruding structure (the first turning portion 121 and/or the second turning portion 122). A third distance h3 is present between the upper surface 110a and the lower surface 110b of the device 110, and the third distance h3 is greater than the first distance h1. In this way, the aforementioned protruding structure may be prevented from protruding downward from the lower surface 110b of the device 110 (the outer electrode surface of the first electrode 116 or the second electrode 117). Therefore, when the device 110 is bonded, the possibility that the first electrode 116 or the second electrode 117 cannot be effectively bonded to the electrode on the target substrate can be reduced.

In this embodiment, the device 110 may be disposed on the carrier 130 through the fixed structure 120.

In this embodiment, a second distance h2 is present between the lower surface 110b of the device 110 and the carrier 130, and the first distance h1 is greater than the second distance h2. In this way, when the device 110 is pressed down to be grasped, the possibility that the apparatus (e.g., a transfer apparatus 600 described later) for pressing down/grasping the device 110 may touch the vertical fixing structure 120 in the vertical direction during the pressing down process may be avoided. Therefore, the yield of the process of transferring the device 110 may be improved.

In this embodiment, the fixed structure 120 further includes a first supporting portion 123. The first supporting portion 123 is connected to the first turning portion 121, and the first supporting portion 123 is connected to the carrier 130. The first supporting portion 123 may have a third extension direction 123d. The third extension direction 123d is different from the first extension direction 121d.

In this embodiment, the height of the first supporting portion 123 is greater than the distance between the device 110 and the carrier 130. That is, the distance between the surface 130a of the carrier 130 and the first turning portion 121 is greater than the second distance h2 between the surface 130a of the carrier 130 and the lower surface 110b of the device 110. In this way, an air gap may be present between the device 110 and the carrier 130. In other words, a space not occupied by a physical object may be present between the device 110 and the carrier 130.

In this embodiment, the fixed structure 120 may further include a second supporting portion 124. The second supporting portion 124 is connected to the second turning portion 122, and the second supporting portion 124 is connected to the carrier 130. The second supporting portion 124 may have a fourth extension direction 124d. The fourth extension direction 124d is different from the second extension direction 122d.

In this embodiment, the height of the second supporting portion 124 is greater than the distance between the device 110 and the carrier 130. That is, the distance between the surface 130a of the carrier 130 and the second turning portion 122 is greater than the shortest distance between the surface 130a of the carrier 130 and the lower surface 110b of the device 110.

In this embodiment, the fixed structure 120 is a continuous structure. In other words, the connecting portion 125, the first turning portion 121, the first supporting portion 123, part of the continuous structure (e.g., part of the connecting portion 125) located on the second side surface 110d of the device 110, the second turning portion 122, and the second supporting portion 124 include substantially the same material.

In this embodiment, the device 110 is a micro LED (μLED). For example, from the top view direction (e.g., the direction as shown in FIG. 1I), the device 110 is a micro LED of a size substantially about (1 μm to 100 μm)×(1 μm to 100 μm).

In this embodiment, the upper surface 110a of the device 110 may be the surface 113a of the second type semiconductor layer 113 away from the first type semiconductor layer 111, but the disclosure is not limited thereto.

In this embodiment, the first side surface 110c and the second side surface 110d of the device 110 may be part of the surface of the patterned isolating layer 115.

In this embodiment, at least a part of the lower surface 110b of the device 110 may be part of the surface of the patterned isolating layer 115 away from the upper surface 110a, but the disclosure is not limited thereto.

In this embodiment, the device 110 may further include the first conductive layer 114, but the disclosure is not limited thereto.

In this embodiment, the device 110 may include the first electrode 116 and the second electrode 117. At least a part of the lower surface 110b of the device 110 may be part of the surface of the first electrode 116 away from the upper surface 110a. In addition, at least a part of the lower surface 110b of the device 110 may be part of the surface of the second electrode 117 away from the upper surface 110a. Nonetheless, the disclosure is not limited thereto.

Figure 2A:
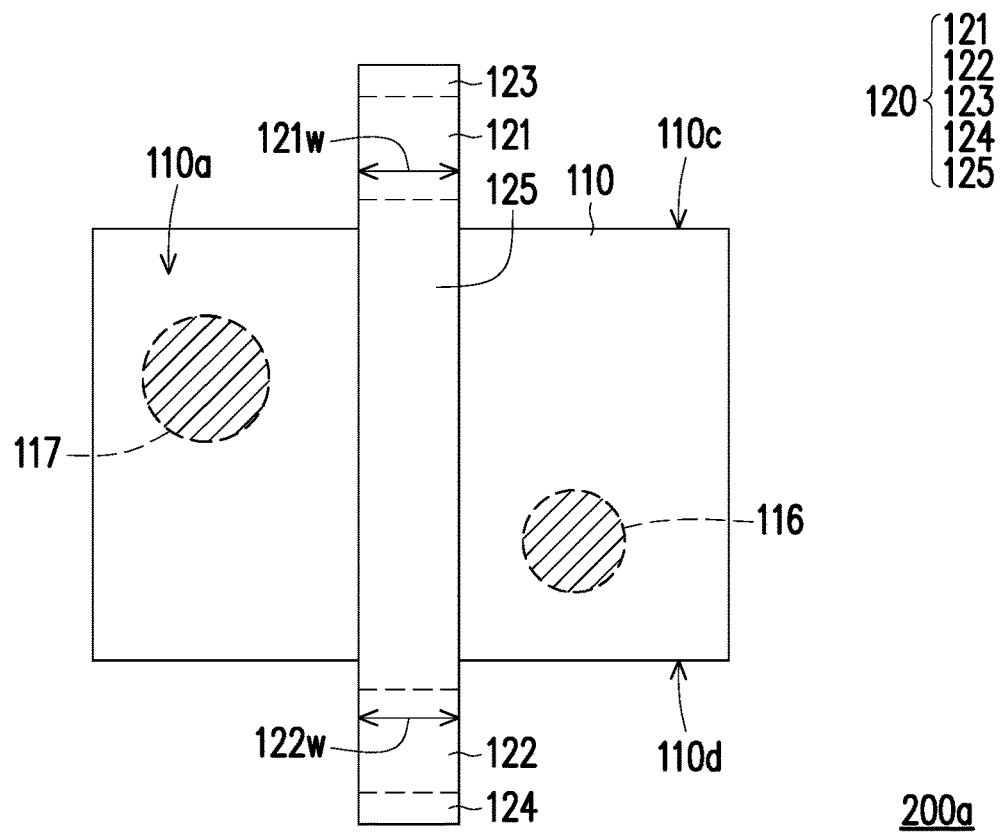
FIG. 2A to FIG. 2G are schematic partial top views of a micro device structure according to another exemplary embodiment.

FIG. 2A is a schematic partial top view of a micro device structure according to another exemplary embodiment. In this embodiment, a micro device structure 200 is similar to the micro device structure 100 of the first embodiment. The same or similar components are denoted by the same or similar reference numerals, have similar functions, materials, or configurations, and description thereof is omitted.

With reference to FIG. 1H and FIG. 2A, a micro device structure 200a includes the device 110 and the fixed structure 120. In addition, the fixed structure 120 includes the connecting portion 125 and the first turning portion 121. The connecting portion 125 extends at least from the upper surface 110a of the device 110 to the first side surface 110c. The first turning portion 121 is connected with the connecting portion 125. Along the first extension direction 121d, the first turning portion 121 may extend outward from the first side surface 110c of the device 110 (i.e., in a direction away from the device 110).

The fixed structure 120 of this embodiment is similar to the above-mentioned fixed structure 120, and the difference lies in that, from the top view direction (e.g., the direction as shown in FIG. 2A), the connecting portion 125 is located between the first electrode 116 and the second electrode 117.

Similar to the micro device structure 100 or the micro device structure 200a, other micro device structures 200b, 200c, 200d, 200e, 200f, and 200g may be as shown in FIG. 2B to FIG. 2G.

Figure 2B:
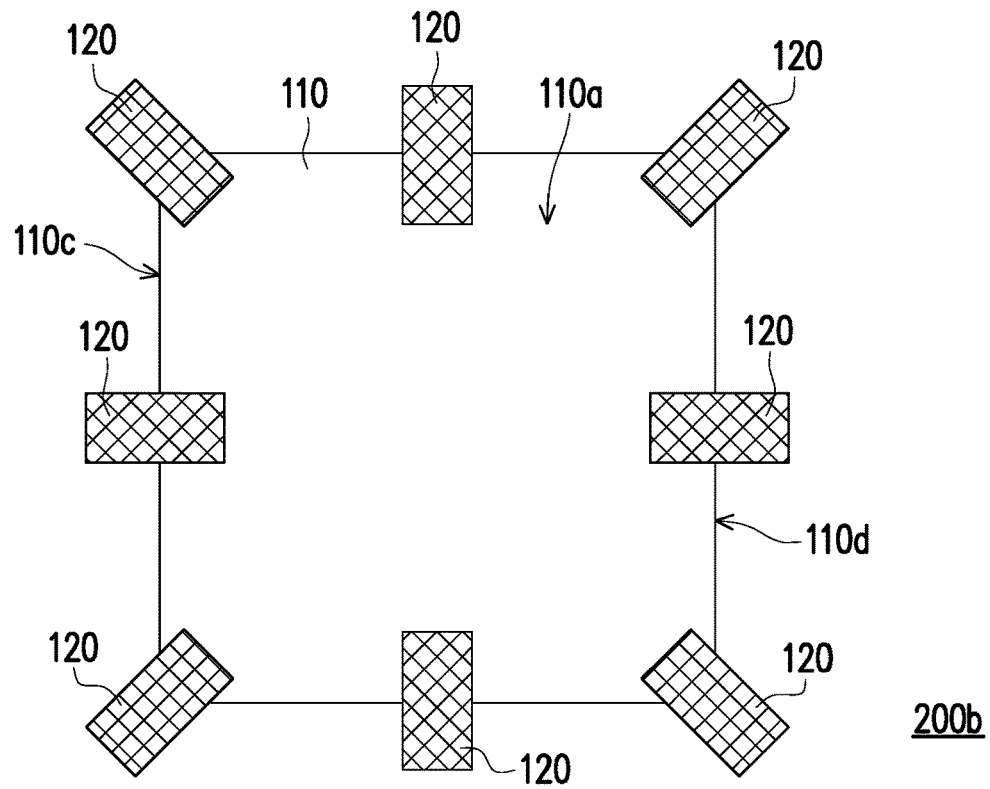

As shown in FIG. 2B, from the top view direction, in the micro device structure 200b, the fixed structure 120 is a plurality of structures separated from each other and is scattered on the periphery of the device 110. The fixed structure 120 may be positioned on the four sides, the four corners, or a combination thereof of the device 110. A portion of the separated structure of the fixed structure 120 is connected with the device 110, and another portion of the separated structure of the fixed structure 120 extends to the outside of the device 110. As shown in FIG. 2B, from the top view direction, a corresponding pattern of the fixed structure 120 may have point symmetry and/or plane symmetry.

Figure 2C:
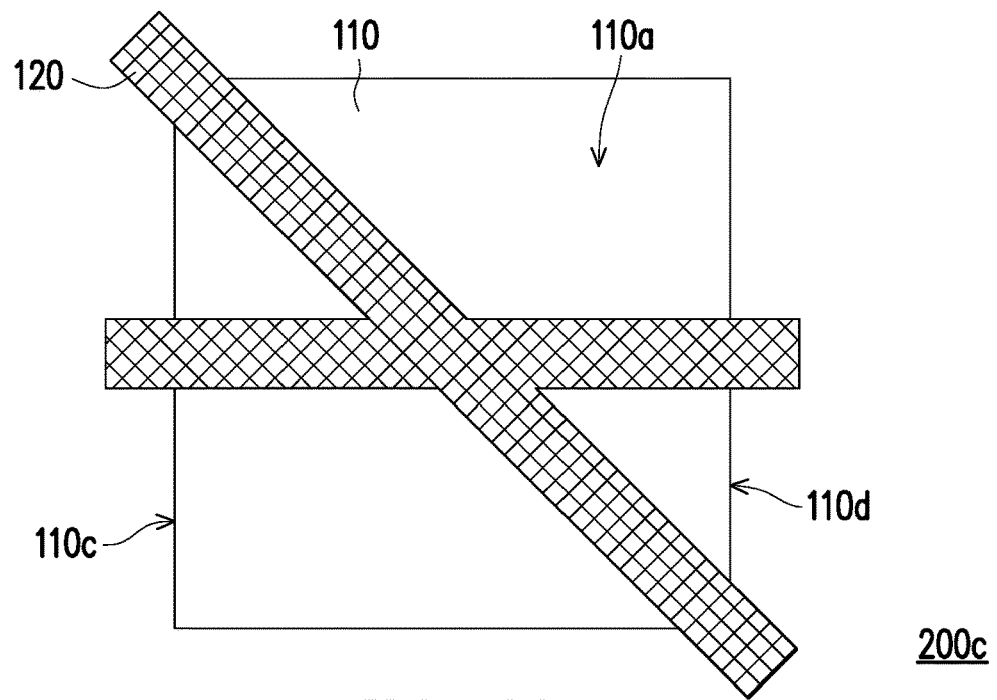

As shown in FIG. 2C, from the top view direction, in the micro device structure 200c, the fixed structure 120 is in a single structure. The fixed structure 120 may include a first portion and a plurality of second portion. The first portion covers the upper surface 110a of the device 110. The second portion extends to the outside of the device 110 (e.g., extends from the upper surface 110a of the device 110 to the side surface 110c, and extends outward from the side surface of the device 110). The first portion of the fixed structure 120 does not cover the entire upper surface 110a of the device 110. The second portion may be connected to the first portion respectively. As shown in FIG. 2C, from the top view direction, a corresponding pattern of the fixed structure 120 may have point symmetry.

Figure 2D:
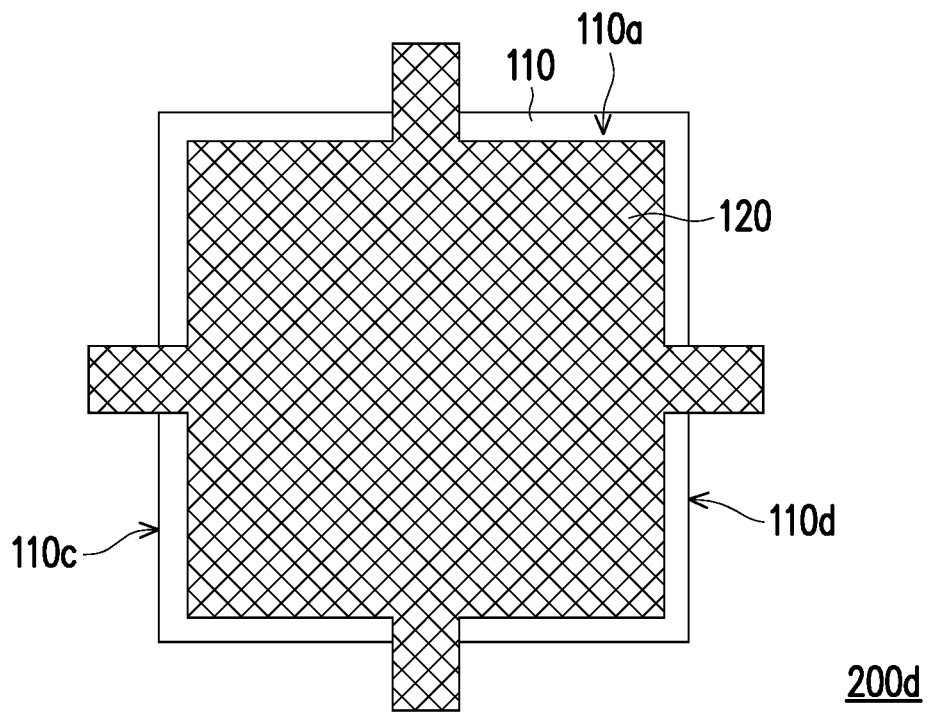

As shown in FIG. 2D, from the top view direction, in the micro device structure 200d, the fixed structure 120 is in a single structure. The fixed structure 120 may include a first portion and a plurality of second portion. The first portion covers the upper surface 110a of the device 110. The second portion extends to the outside of the device 110 (e.g., extends from the upper surface 110a of the device 110 to the side surface 110c, and extends outward from the side surface of the device 110). The first portion of the fixed structure 120 does not cover the entire upper surface 110a of the device 110. The second portion may be connected to the first portion respectively. As shown in FIG. 2D, from the top view direction, a corresponding pattern of the fixed structure 120 may have point symmetry and/or plane symmetry.

Figure 2E:
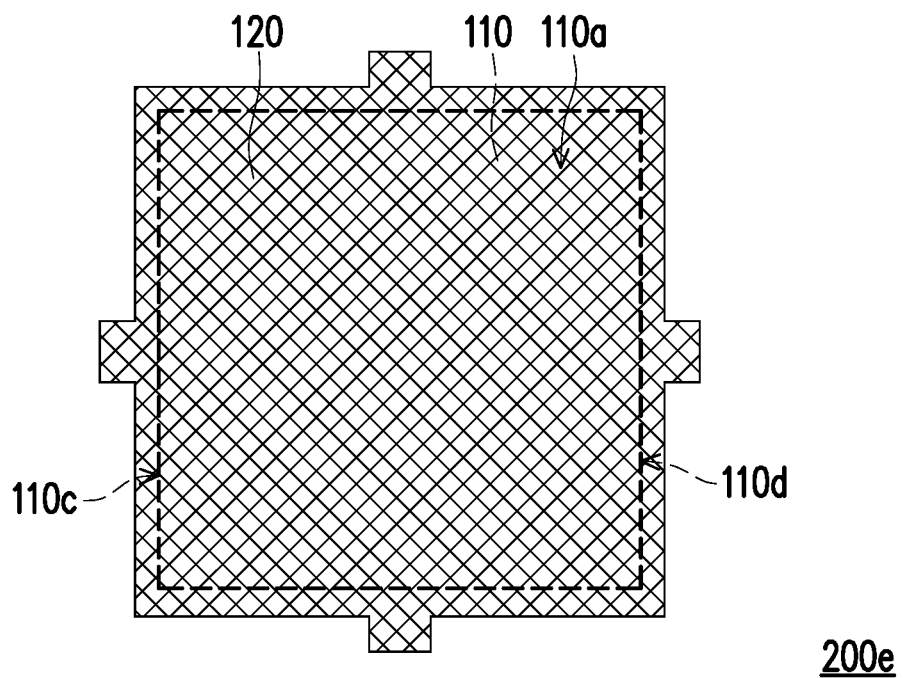

As shown in FIG. 2E, from the top view direction, in the micro device structure 200e, the fixed structure 120 is in a single structure. The fixed structure 120 may include a first portion and a plurality of second portion. The first portion covers the upper surface 110a of the device 110. The second portion extends to the outside of the device 110 (e.g., extends from the upper surface 110a of the device 110 to the side surface 110c, and extends outward from the side surface of the device 110). The first portion of the fixed structure 120 covers the entire upper surface 110a of the device 110. The second portion may surround the first portion. As shown in FIG. 2E, from the top view direction, a corresponding pattern of the fixed structure 120 may have point symmetry and/or plane symmetry.

Figure 2F:
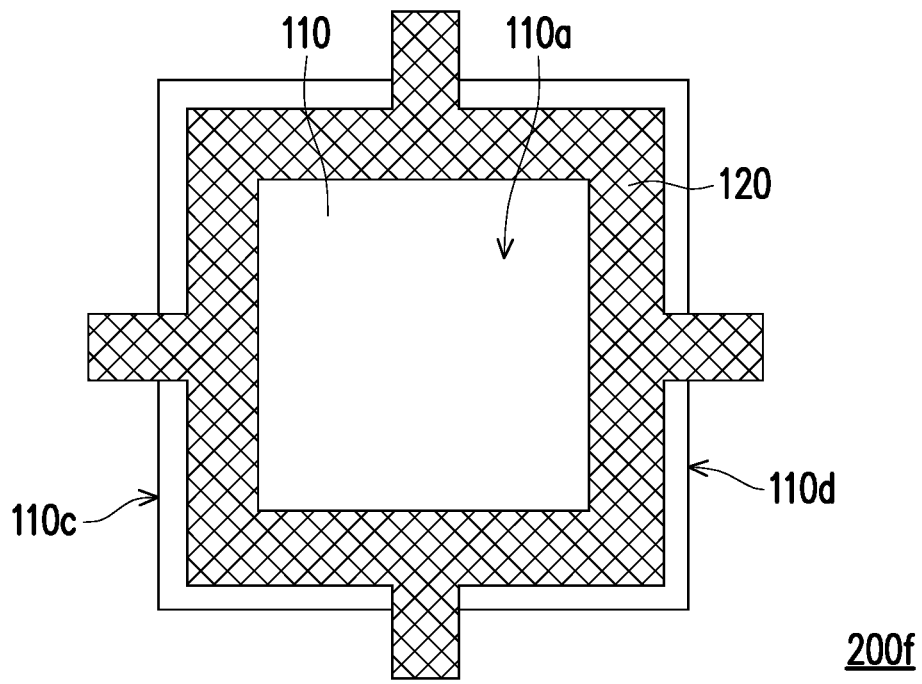

As shown in FIG. 2F, from the top view direction, in the micro device structure 200f, the fixed structure 120 is in a single structure. The fixed structure 120 may include a first portion and a plurality of second portion. The first portion covers the upper surface 110a of the device 110. The second portion extends to the outside of the device 110 (e.g., extends from the upper surface 110a of the device 110 to the side surface 110c, and extends outward from the side surface of the device 110). The first portion of the fixed structure 120 does not cover the entire upper surface 110a of the device 110. A circular or square opening or an opening in other pattern shapes may be present in the first portion of the fixed structure 120. The second portion may be connected to the first portion respectively. As shown in FIG. 2F, from the top view direction, a corresponding pattern of the fixed structure 120 may have point symmetry and/or plane symmetry.

Figure 2G:
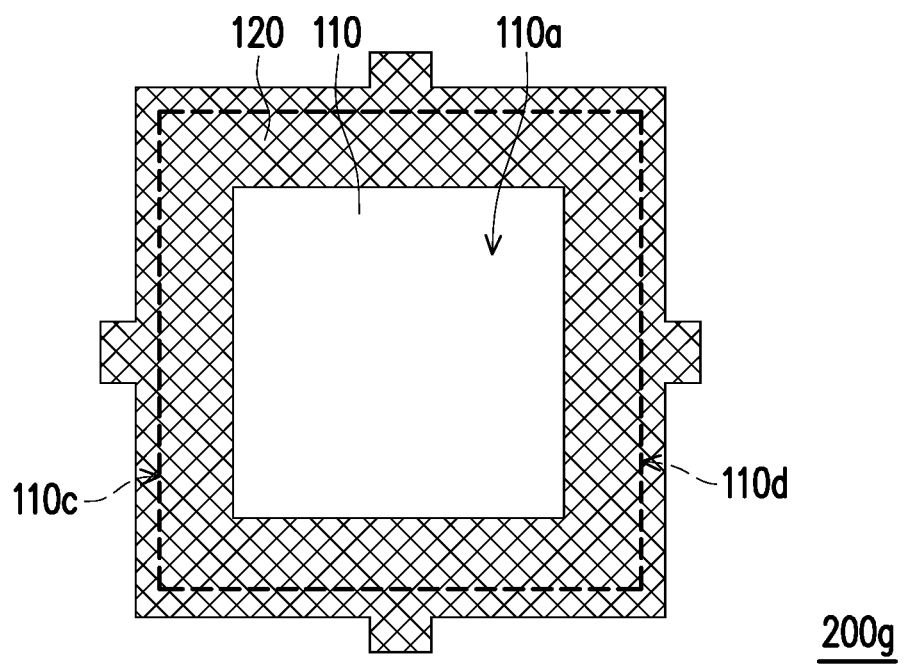

As shown in FIG. 2G, from the top view direction, in the micro device structure 200g, the fixed structure 120 is in a single structure. The fixed structure 120 may include a first portion and a second portion. The first portion covers the upper surface 110a of the device 110. The second portion extends to the outside of the device 110 (e.g., extends from the upper surface 110a of the device 110 to the side surface 110c, and extends outward from the side surface of the device 110). The first portion of the fixed structure 120 does not cover the entire upper surface 110a of the device 110. A circular or square opening or an opening in other pattern shapes may be present in the first portion of the fixed structure 120. The second portion may be connected to the first portion. As shown in FIG. 2G, from the top view direction, a corresponding pattern of the fixed structure 120 may have point symmetry and/or plane symmetry.

Figure 3A:
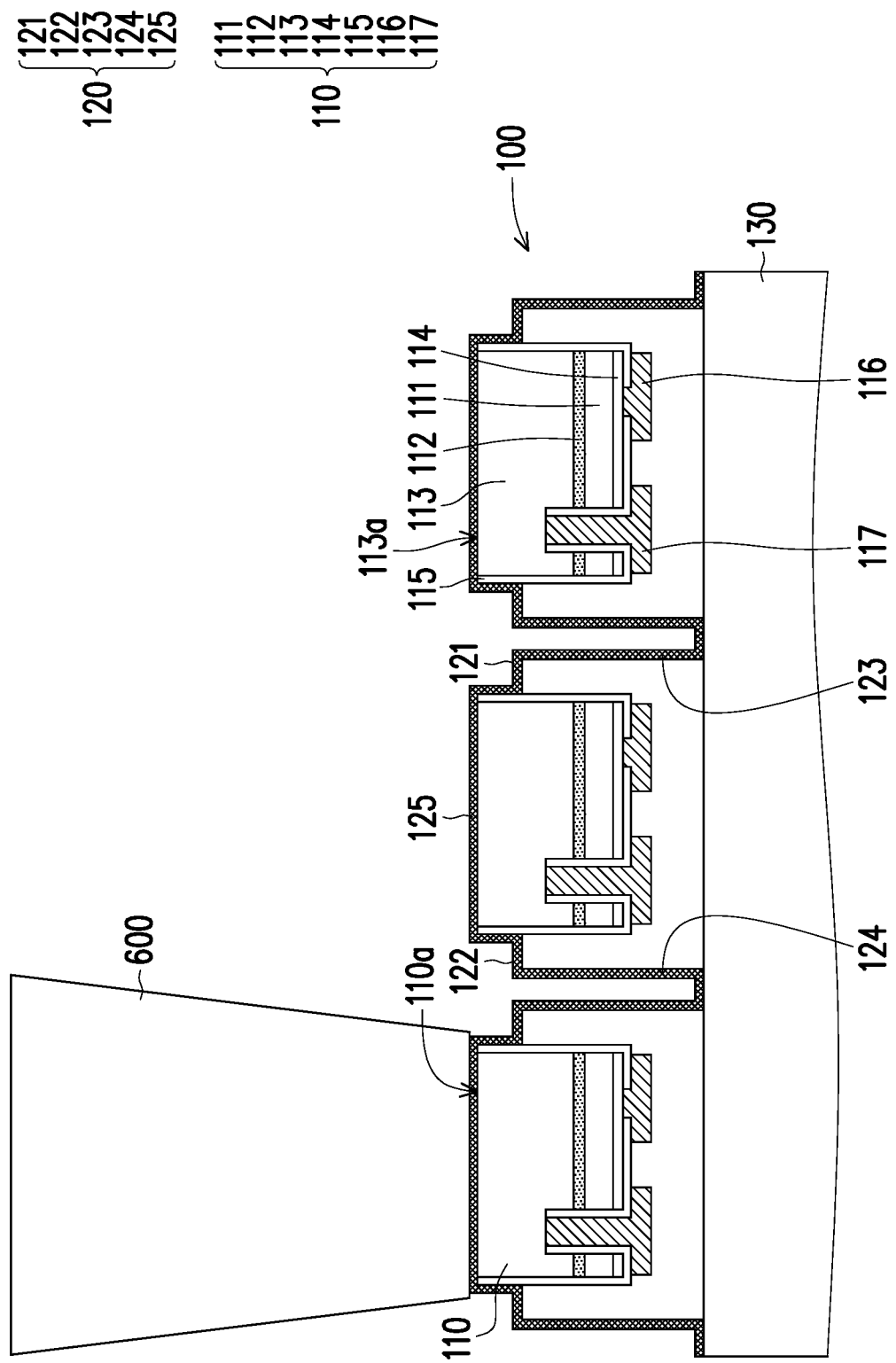
FIG. 3A to FIG. 3C are schematic partial cross-sectional views of part of a manufacturing method of a display apparatus according to an exemplary embodiment.
Figure 3B:
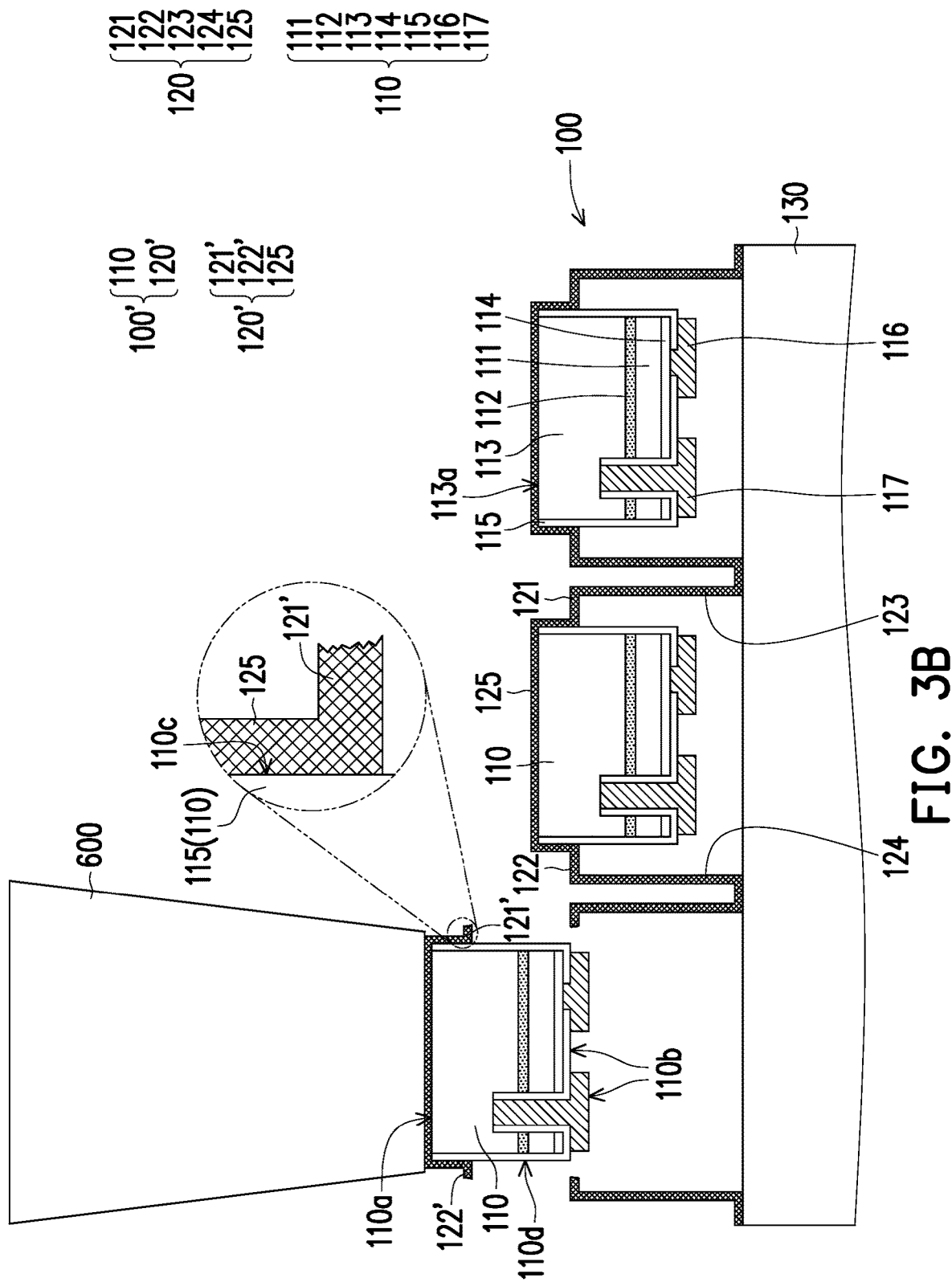
Figure 3C:
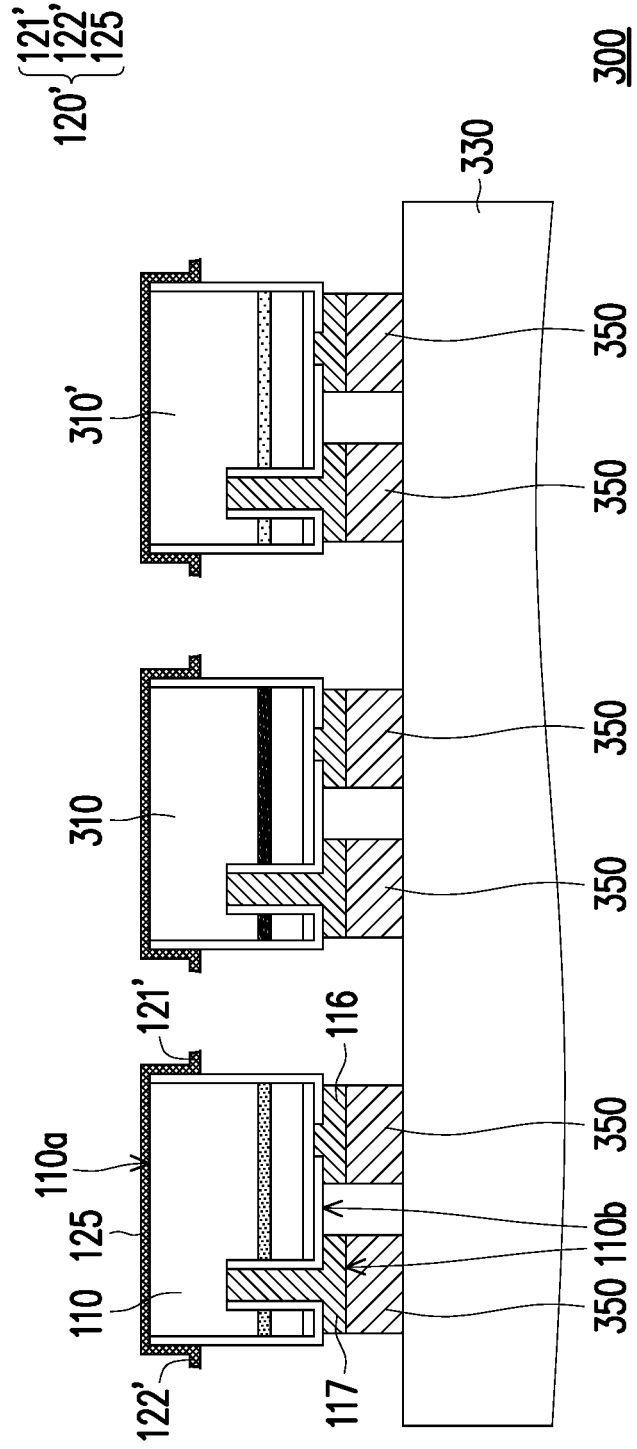

FIG. 3A to FIG. 3C are schematic partial cross-sectional views of part of a manufacturing method of a display apparatus according to an exemplary embodiment.

With reference to FIG. 1I and FIG. 3A, a micro device structure is provided. In this embodiment, the provided micro device structure is exemplified with the micro device structure 100 of the first embodiment. Therefore, in the following subsequent description and labeling, the micro device structure 100 of the first embodiment is taken as an exemplary example. In addition, the same or similar components are denoted by the same or similar reference numerals, have similar functions, materials, or configurations, and description thereof is omitted. However, in other embodiments not shown, the provided micro device structure may be other micro device structures similar to the micro device structure 100 of the first embodiment (e.g., the micro device structure 200 of the second embodiment).

With reference to FIG. 3A, the device 110 in the micro device structure 100 may be grasped by a transfer apparatus 600. For example, the device 110 may be grasped from the upper surface 110a (e.g., the surface of the fixed material layer 820) of the device 110 with the transfer apparatus 600.

Notably, the type of the transfer apparatus 600 is not limited by the disclosure. In addition, only a part of the transfer apparatus 600 is schematically shown in the drawings (e.g., FIG. 3A or FIG. 3B). That is to say, the illustration of the transfer apparatus 600 in the drawings does not form limitation on the appearance, type, quantity, pattern, or pick-and-place mode of the transfer apparatus 600.

With reference to FIG. 3A to FIG. 3B, during the process of pressing or lifting by the transfer apparatus 600, stress is generated between the device 110 and the carrier 130. In addition, the stress causes generation of corresponding cracks in the fixed structure 120 between the device 110 and the carrier 130. In this way, the device 110 may be separated from the carrier 130 and may be transferred.

In this embodiment, the first extension direction 121d of the first turning portion 121 and/or the second extension direction 122d of the second turning portion 122 are substantially parallel to the upper surface 110a of the device 110. In this way, during the process of pressing or lifting by the transfer apparatus 600, since the direction of the stress is substantially perpendicular to the first extension direction 121d and/or the second extension direction 122d, corresponding cracks may be relatively likely to be generated at a certain place in the first turning portion 121 and/or a certain place in the second turning portion 122, and the speed or yield during the transfer process may be improved.

In this embodiment, the width 121w (labeled in FIG. 1I and FIG. 2) of the first turning portion 121 is between 0.1 μm to 20 μm, and/or the thickness 121h (labeled in FIG. 1H) of the first turning portion 121 is less than 3 μm; and/or the width 122w (labeled in FIG. 1I and FIG. 2) of the second turning portion 122 is between 0.1 μm to 20 μm, and/or the thickness 122h (labeled in FIG. 1H) of the second turning portion 122 is less than 3 μm. In this way, during the process of pressing or lifting by the transfer apparatus 600, corresponding cracks may be more likely to be generated at a certain place in the first turning portion 121 and/or a certain place in the second turning portion 122, and the speed or yield of the transfer process may be improved.

With reference to FIG. 3B, in this embodiment, after corresponding cracks are generated at a certain place in the first turning portion 121 with the transfer apparatus 600, a fixed structure 120' remained on the device 110 still substantially extends from the upper surface 110a of the device 110 to the first side surface 110c. In addition, the fixed structure 120' remained on the device 110 substantially includes a first turning portion 121' extending outward from the first side surface 110c. Moreover, the first turning portion 121' is located between the upper surface 110a and the lower surface 110b. In other words, the device 110 and the fixed structure 120' may still be referred to as a micro device structure 100'. Herein, a tip of the first turning portion 121' away from the first side surface 110c is suspended. In other words, the tip of the first turning portion 121' away from the first side surface 110c is a free tip.

In this embodiment, the tip of the first turning portion 121' away from the first side surface 110c has an irregular surface, but the disclosure is not limited thereto.

Similarly, in this embodiment, the fixed structure 120' may substantially further include a second turning portion 122' extending outward from a second side surface 110d'. In addition, the second turning portion 122' is located between the upper surface 110a and the lower surface 110b. Herein, a tip of the second turning portion 122' away from the second side surface 110d is suspended. In other words, the tip of the second turning portion 122' away from the second side surface 110d is a free tip.

Similarly, in this embodiment, the tip of the second turning portion 122' away from the second side surface 110d has an irregular surface.

With reference to FIG. 3B to FIG. 3C, with the transfer apparatus 600, the device 110 may be disposed on a circuit board 330. Then, the device 110 may be electrically connected to a corresponding circuit (not shown) in the circuit board 330.

In this embodiment, with the lower surface 110b of the device 110 facing the circuit board 330, the first electrode 116 and the second electrode 117 of the device 110 may be electrically connected to a corresponding circuit (not shown) in the circuit board 330. In addition, the fixed structure 120' extends from the upper surface 110a of the device 110 to the first side surface 110c and the second side surface 110d, and the first turning portion 121' and/or the second turning portion 122' are between the upper surface 110a and the lower surface 110b. Therefore, when or after the device 110 is disposed on the circuit board 330, influence of the fixed structure 120' on the device 110 and/or the circuit board 330 may be reduced.

In this embodiment, the circuit board 330 may be a rigid board or a flexible board, and the disclosure is not limited thereto.

In this embodiment, the circuit board 330 may further includes active devices (e.g., transistors), passive devices (e.g., capacitors, resistors, or inductors) or other suitable electronic devices, which are not limited by the disclosure.

In this embodiment, the device 110 and the circuit board 330 may be electrically connected to each other through a conductive connector 350. The conductive connector 350 may include a conductive pillar, a solder ball, a conductive bump, a conductive sheet, a conductive glue, a conductive film, a conductive member in other forms or in other shapes, or a combination of the above, but the disclosure is not limited thereto.

In this embodiment, a device 310 and a device 310' may be disposed on the circuit board 330 in a manner same as, similar to, or different from that as described above. In addition, the order of a step of disposing the device 110, a step of disposing the device 310, and a step of disposing the device 310' is not limited in the present invention. is not limited in the disclosure.

In this embodiment, the device 110, the device 310 and/or the device 310' is/are micro LEDs, but the disclosure is not limited thereto. In this embodiment, the device 110, the device 310, and the device 310' may emit light of different colors, but the disclosure is not limited thereto.

After the above process, a display apparatus 300 of this embodiment may be substantially completed.

FIG. 3C may be a schematic partial cross-sectional view of a display apparatus according to an exemplary embodiment.

With reference to FIG. 3C, the display apparatus 300 includes the device 110 and the first turning portion 121'. The first turning portion 121' is between the upper surface 110a and the lower surface 110b. The first turning portion 121' extends outward from the first side surface 110c of the device 110. The width 121w of the first turning portion 121' is between 0.1 μm and 10 μm, and the thickness 121h of the first turning portion 121' is less than 3 μm. The device 110 of the display apparatus 300 is a micro LED.

Figure 4:
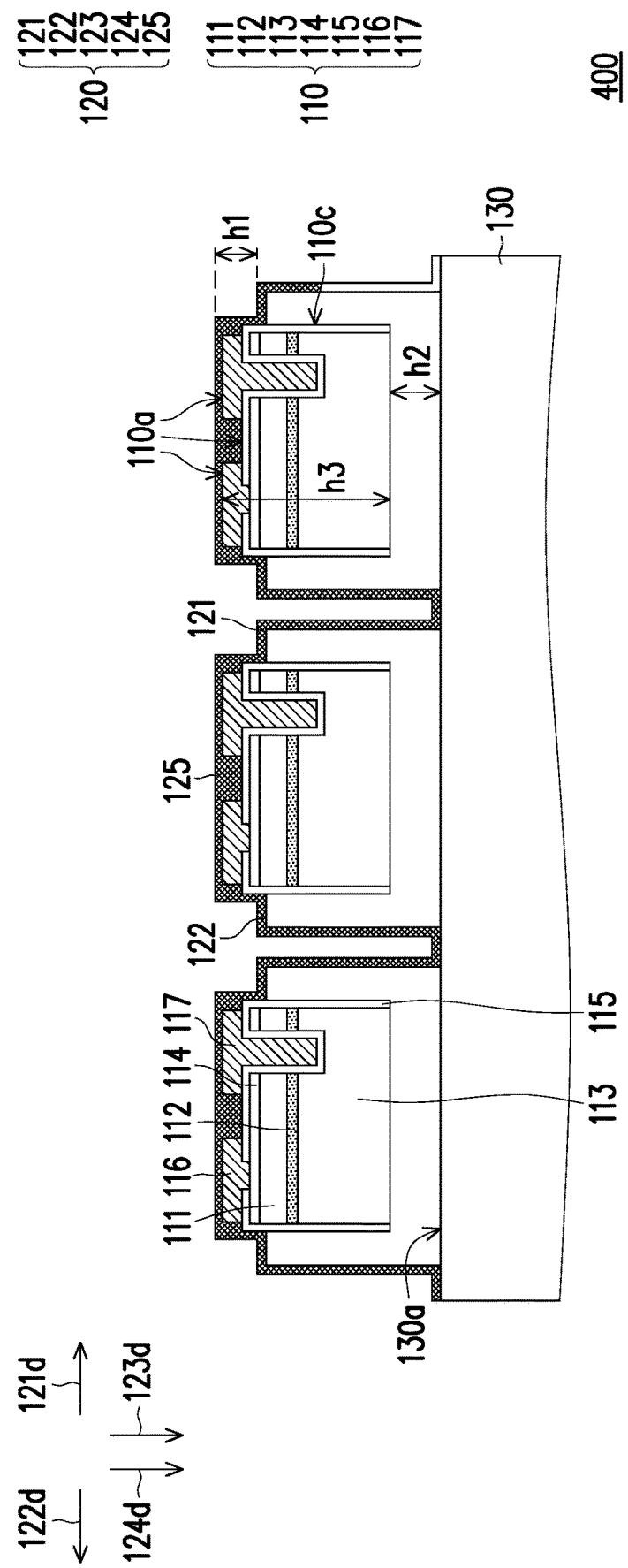
FIG. 4 is a schematic partial cross-sectional view of a micro device structure according to an exemplary embodiment.

FIG. 4 is a schematic partial cross-sectional view of a micro device structure according to an exemplary embodiment.

In a micro device structure 400 of this embodiment, the lower surface 110b of the device 110 may be the surface of the second type semiconductor layer 113 away from the first type semiconductor layer 111. Alternatively, a part of the upper surface 110a of the device 110 may be part of the surfaces of the patterned isolating layer 115, the first electrode 116, and/or the second electrode 117 away from the second type semiconductor layer 113.

Figure 5:
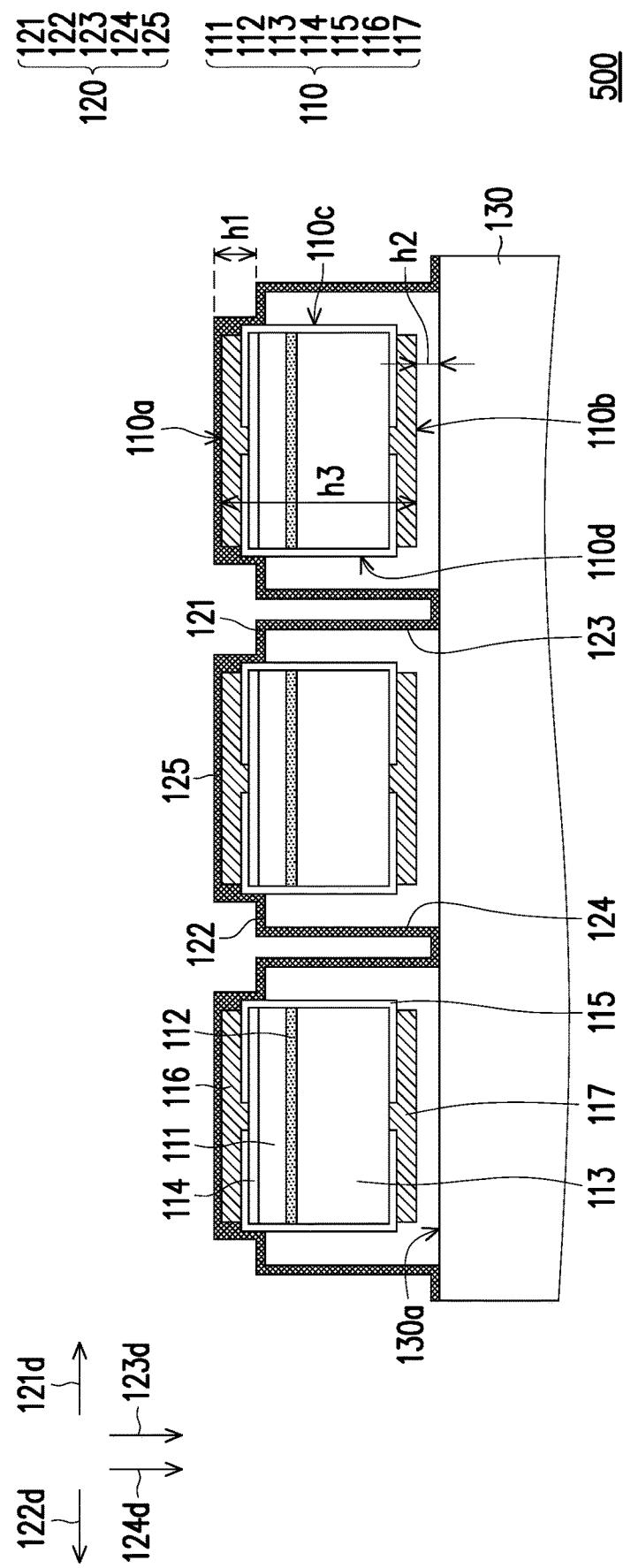
FIG. 5 is a schematic partial cross-sectional view of a micro device structure according to an exemplary embodiment.

FIG. 5 is a schematic partial cross-sectional view of a micro device structure according to an exemplary embodiment.

In a micro device structure 500 of this embodiment, the upper surface 110a of the device 110 may be part of the surface of the first electrode 116. Alternatively, the lower surface 110b of the device 110 may be part of the surface of the second electrode 117.

In summary of the foregoing, in an embodiment of the disclosure, during the process of manufacture or application of the micro device structure or the display apparatus, the device therein may be efficiently transferred.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided that they fall within the scope of the following claims and their equivalents.

What is claimed is:

1. A micro device structure, comprising:
a device, having an upper surface, a lower surface, and a first side surface, wherein the lower surface is opposite to the upper surface, and the first side surface connects the upper surface and the lower surface; and
a fixed structure, comprising a connecting portion and a first turning portion, wherein the connecting portion extends at least from the upper surface of the device to the first side surface, and the first turning portion is in contact with a first tip of the connecting portion and extends outward from the first side surface to be away from the first side surface, wherein the first tip of the connecting portion is located on the first side surface between the upper surface and the lower surface, and the device comprises:
at least one electrode, located on the lower surface of the device,
wherein a tip of the first turning portion away from the first side surface is suspended.

2. The micro device structure according to claim 1, wherein the fixed structure exposes a part of the first side surface away from the upper surface.

3. The micro device structure according to claim 1, wherein a width of the first turning portion is between 0.1 μm to 10 μm, and/or a thickness of the first turning portion is less than 3 μm.

4. The micro device structure according to claim 1, wherein a distance is present between the tip of the first turning portion away from the first side surface and the first side surface.

5. The micro device structure according to claim 1, wherein the fixed structure comprises a same material.

6. The micro device structure according to claim 1, wherein the fixed structure is a continuous structure.

7. The micro device structure according to claim 1, wherein the fixed structure exposes part of the upper surface.

8. The micro device structure according to claim 1, wherein a tip of the first turning portion away from the first side surface has an irregular surface.

9. The micro device structure according to claim 1, wherein an extension direction of the first turning portion is substantially parallel to the upper surface of the device.

10. The micro device structure according to claim 1, wherein the device further has a second side surface, the second side surface connects the upper surface and the lower surface, the second side surface is opposite to the first side surface, the fixed structure further extends from the upper surface of the device to the second side surface, and the fixed structure further comprises a second turning portion extending outward from the second side surface, wherein the second turning portion is in contact to be connected with a second tip of the connecting portion and extends outward from the second side surface to be away from the second side surface, wherein the second tip of the connecting portion is located on the second side surface between the upper surface and the lower surface.

11. The micro device structure according to claim 1, wherein a first distance is present between the upper surface and the first turning portion, a third distance is present between the upper surface and the lower surface, and the third distance is greater than the first distance.

12. A micro device structure, comprising:
a device, having an upper surface, a lower surface, and a first side surface, wherein the lower surface is opposite to the upper surface, and the first side surface connects the upper surface and the lower surface;
a fixed structure, comprising a connecting portion and a first turning portion, wherein the connecting portion extends at least from the upper surface of the device to the first side surface, and the first turning portion is in contact with a first tip of the connecting portion and extends outward from the first side surface to be away from the first side surface, wherein the first tip of the connecting portion is located on the first side surface between the upper surface and the lower surface; and
a carrier, wherein the device is disposed on the carrier through the fixed structure, wherein the device comprises:
at least one electrode, located on the lower surface of the device, wherein an air gap is present between the device and the carrier.

13. The micro device structure according to claim 12, wherein the fixed structure further comprises a first supporting portion connected to the first turning portion, and the first supporting portion is connected to the carrier.

14. The micro device structure according to claim 13, wherein an extension direction of the first turning portion is different from an extension direction of the first supporting portion.

15. The micro device structure according to claim 13, wherein a height of the first supporting portion is greater than a distance between the device and the carrier.

16. A display apparatus, comprising:
a micro light emitting device, having an upper surface, a lower surface and a first side surface, wherein the lower surface is opposite to the upper surface, and the first side surface connects the upper surface and the lower surface; and
a fixed structure, comprising a connecting portion and a first turning portion, wherein the connecting portion extends at least from the upper surface of the device to the first side surface, and the first turning portion is in contact with a first tip of the connecting portion and extends outward from the first side surface to be away from the first side surface, wherein the first tip of the connecting portion is located on the first side surface between the upper surface and the lower surface, and a tip of the first turning portion away from the first side surface is suspended, and the micro light emitting device comprises:

at least one electrode, located on the lower surface of the micro light emitting device.

\* \* \* \* \*